United States Patent
Chen

(10) Patent No.: US 11,956,958 B2
(45) Date of Patent: Apr. 9, 2024

(54) METHOD FOR FABRICATING THREE-DIMENSIONAL SEMICONDUCTOR DEVICE USING BURIED STOP LAYER IN SUBSTRATE

(71) Applicant: YANGTZE MEMORY TECHNOLOGIES CO., LTD., Wuhan (CN)

(72) Inventor: He Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 361 days.

(21) Appl. No.: 17/237,577

(22) Filed: Apr. 22, 2021

(65) Prior Publication Data

US 2022/0320132 A1    Oct. 6, 2022

Related U.S. Application Data

(63) Continuation of application No. PCT/CN2021/084043, filed on Mar. 30, 2021.

(51) Int. Cl.
*H10B 43/27*   (2023.01)
*H01L 21/78*   (2006.01)

(52) U.S. Cl.
CPC ......... *H10B 43/27* (2023.02); *H01L 21/7806* (2013.01)

(58) Field of Classification Search
CPC .............................. H10B 43/27; H01L 21/7806
See application file for complete search history.

(56) References Cited

U.S. PATENT DOCUMENTS

| 10,636,813 | B1* | 4/2020 | Xiao | H01L 21/02598 |
| 2004/0099910 | A1 | 5/2004 | Choe et al. | |
| 2006/0128075 | A1* | 6/2006 | Kwon | H01L 21/76243 438/149 |
| 2011/0089524 | A1 | 4/2011 | Nonogaki | |
| 2014/0159066 | A1* | 6/2014 | Hu | H01L 24/75 438/28 |
| 2017/0148664 | A1* | 5/2017 | Rupp | H01L 21/26533 |

(Continued)

FOREIGN PATENT DOCUMENTS

| CN | 101044611 A | 9/2007 |
| CN | 103066016 A | 4/2013 |

(Continued)

OTHER PUBLICATIONS

International Search Report issued in corresponding International Application No. PCT/CN2021/084043, dated Jan. 5, 2022, 4 pages.

(Continued)

*Primary Examiner* — Robert G Bachner
*Assistant Examiner* — Molly K Reida
(74) *Attorney, Agent, or Firm* — BAYES PLLC

(57) ABSTRACT

Methods for forming a semiconductor device are disclosed. According to some aspects, a first implantation is performed on a first of a first semiconductor structure to form a buried stop layer in the first substrate. A second semiconductor device is formed. The first semiconductor structure and the second semiconductor device are bonded. The first substrate is thinned and the buried stop layer is removed, and an interconnect layer is formed above the thinned first substrate.

20 Claims, 17 Drawing Sheets

(56) References Cited

U.S. PATENT DOCUMENTS

| | | |
|---|---|---|
| 2018/0068886 A1* | 3/2018 | Hammond .............. H01L 21/84 |
| 2020/0176466 A1* | 6/2020 | Yang ...................... H10B 43/40 |
| 2020/0194403 A1 | 6/2020 | Xiao |
| 2021/0111137 A1 | 4/2021 | Chen et al. |

FOREIGN PATENT DOCUMENTS

| | | |
|---|---|---|
| CN | 104701334 A | 6/2015 |
| CN | 105845615 A | 8/2016 |
| CN | 107039252 A | 8/2017 |
| CN | 109844933 A | 6/2019 |
| CN | 110870061 A | 3/2020 |
| CN | 111384919 A | 7/2020 |
| CN | 112424933 A | 2/2021 |
| JP | 201186828 A | 4/2011 |
| JP | 2015015393 A | 1/2015 |
| JP | 2016062901 A | 4/2016 |
| TW | 200703503 A | 1/2007 |

OTHER PUBLICATIONS

Supplemental European Search Report issued in corresponding European Application No. 21933642.7 dated Jul. 31, 2023, 7 pages.

\* cited by examiner

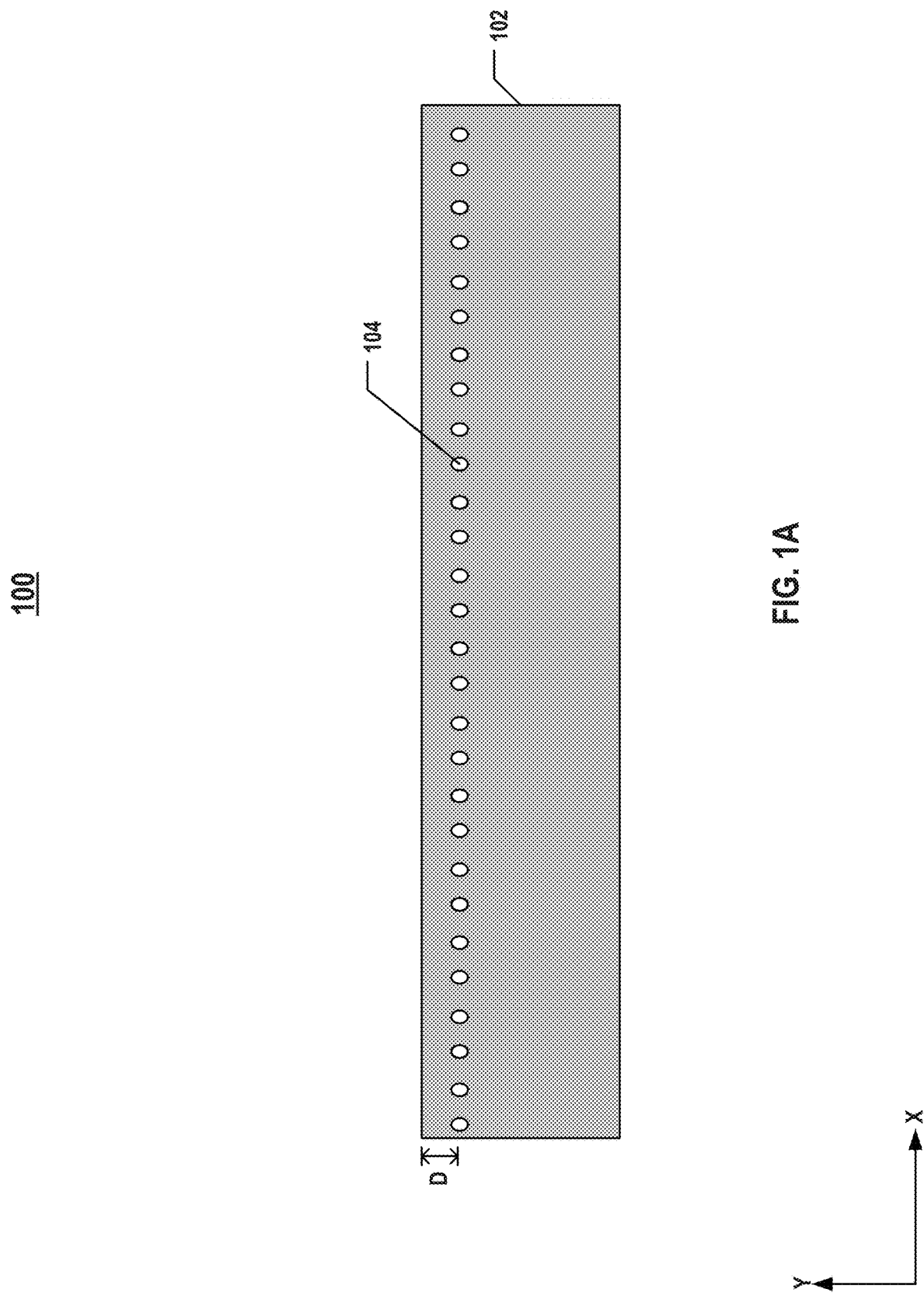

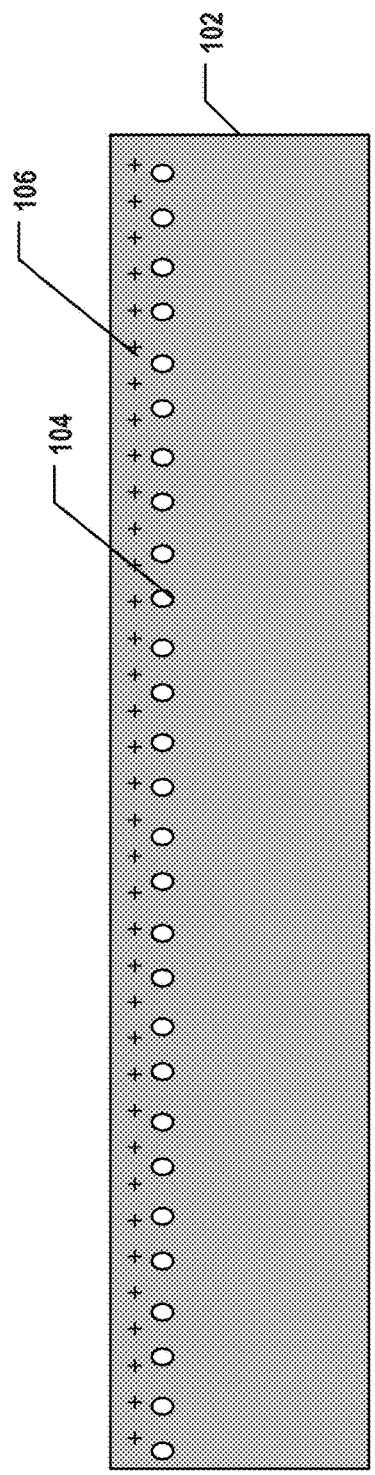
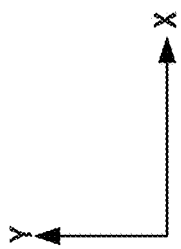
FIG. 1B

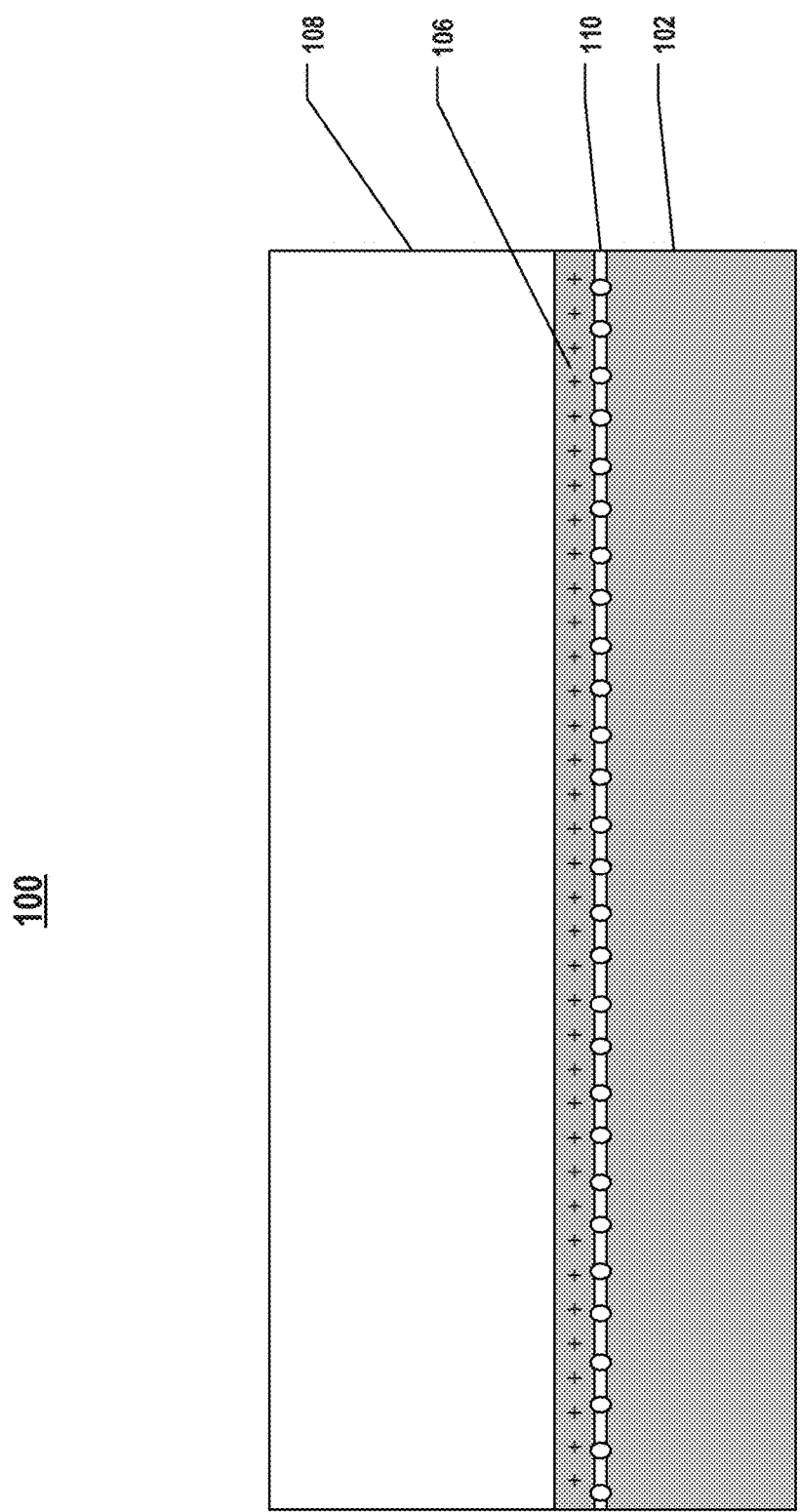
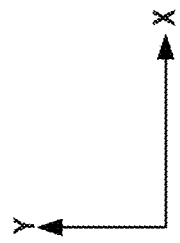
FIG. 1D

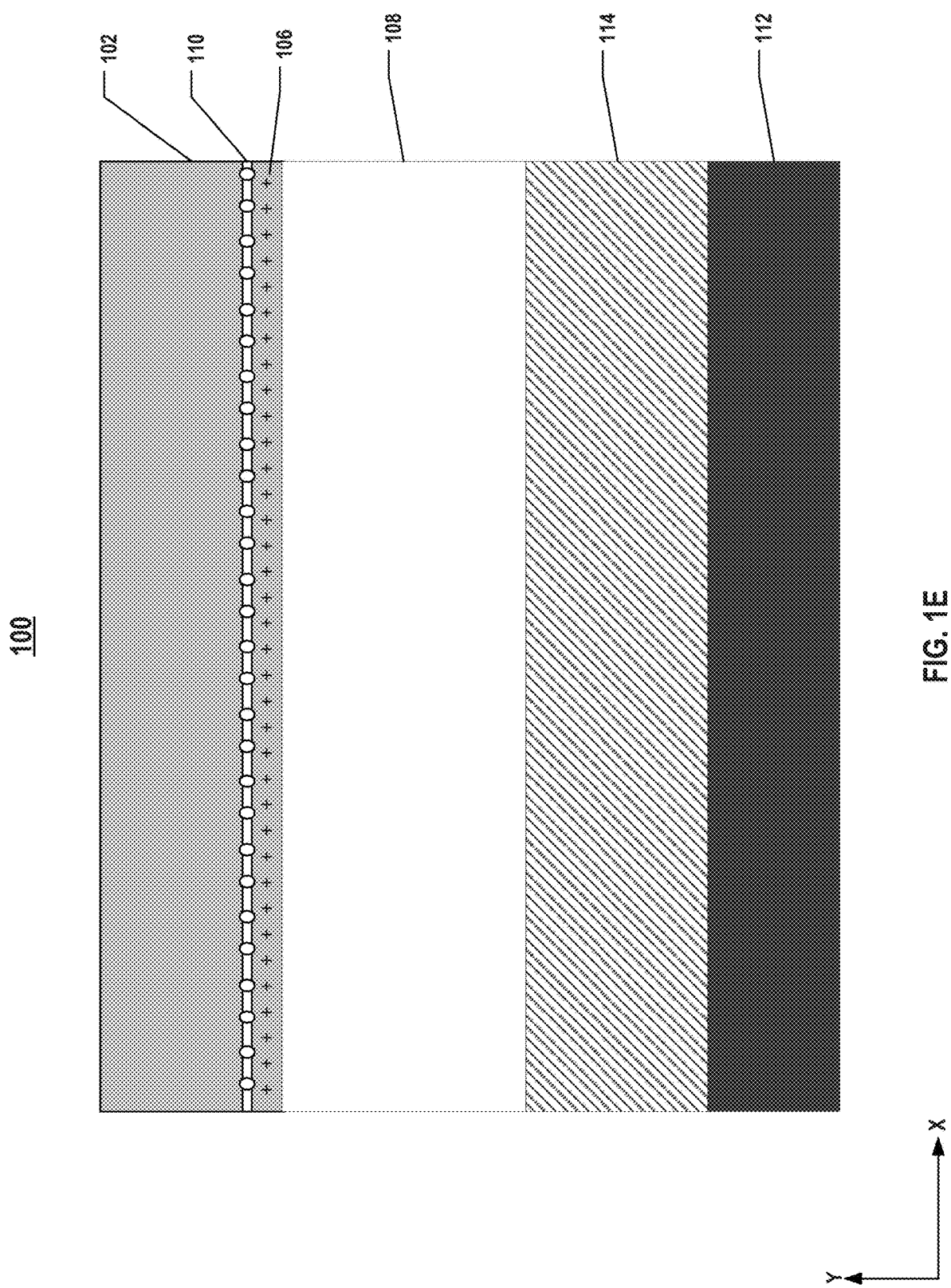

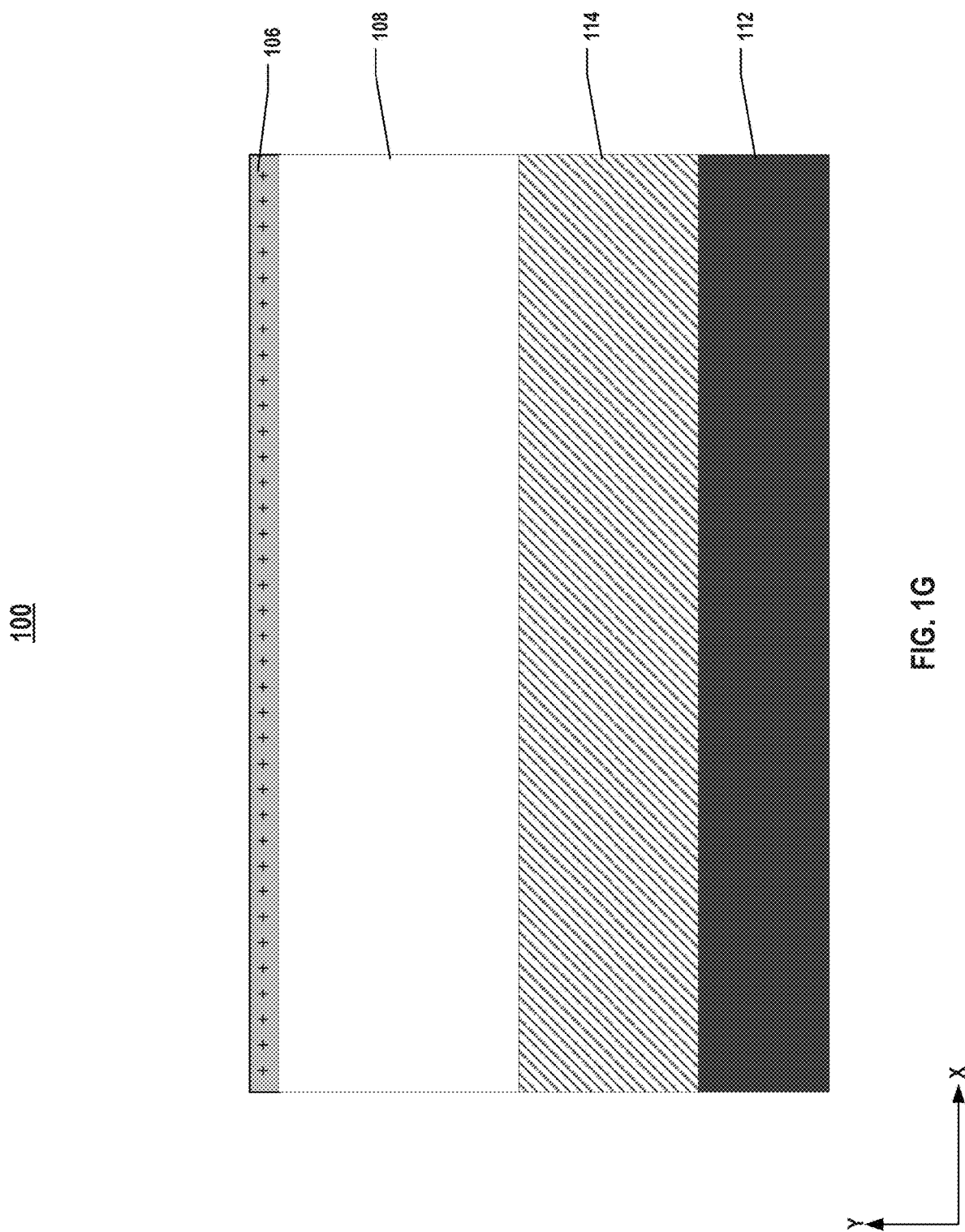

400

```
┌─────────────────────────────────────────────────────────────────┐
│ FORMING A FIRST SEMICONDUCTOR STRUCTURE COMPRISING A FIRST      │──402
│ DEVICE LAYER FORMED ON A FIRST SUBSTRATE, WHEREIN A BURIED STOP │
│ LAYER IS FORMED IN THE FIRST SUBSTRATE                          │
└─────────────────────────────────────────────────────────────────┘
                                 │
                                 ▼
┌─────────────────────────────────────────────────────────────────┐
│ FORMING A SECOND SEMICONDUCTOR STRUCTURE COMPRISING A           │──404
│ SECOND DEVICE LAYER FORMED ON A SECOND SUBSTRATE                │
└─────────────────────────────────────────────────────────────────┘
                                 │
                                 ▼
┌─────────────────────────────────────────────────────────────────┐
│ BONDING THE FIRST SEMICONDUCTOR STRUCTURE AND THE SECOND        │──406
│ SEMICONDUCTOR STRUCTURE IN A FACE-TO-FACE MANNER                │
└─────────────────────────────────────────────────────────────────┘
                                 │
                                 ▼
┌─────────────────────────────────────────────────────────────────┐
│ REMOVING A PORTION OF THE FIRST SUBSTRATE UNTIL BEING STOPPED BY│──408
│ THE BURIED STOP LAYER                                           │
└─────────────────────────────────────────────────────────────────┘
```

FIG. 4

METHOD FOR FABRICATING THREE-DIMENSIONAL SEMICONDUCTOR DEVICE USING BURIED STOP LAYER IN SUBSTRATE

CROSS-REFERENCE TO RELATED APPLICATIONS

This application is continuation of International Application No. PCT/CN2021/084043, filed on Mar. 30, 2021, entitled "METHOD FOR FABRICATING THREE-DIMENSIONAL SEMICONDUCTOR DEVICE USING BURIED STOP LAYER IN SUBSTRATE," which is hereby incorporated by reference in its entirety.

BACKGROUND

The present disclosure relates to methods for forming three-dimensional (3D) semiconductor devices, and more particularly, to methods for 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

Methods for forming 3D semiconductor devices are disclosed herein.

In one aspect, a method for forming a 3D semiconductor device is disclosed. A first implantation is performed on a first substrate of a first semiconductor structure to form a buried stop layer in the first substrate. A second semiconductor structure is formed. The first semiconductor structure and the second semiconductor structure are bonded. The first substrate is thinned and the buried stop layer is removed, and an interconnect layer is formed above the thinned first substrate.

In another aspect, a method for forming a 3D semiconductor device is disclosed. A first semiconductor structure is formed, the first semiconductor structure includes a first substrate and a first semiconductor structure formed on a first substrate. A buried stop layer is formed in the first substrate. A second semiconductor structure is formed, and the second semiconductor structure includes a second semiconductor structure formed on a second substrate. The first semiconductor structure and the second semiconductor structure are bonded in a face-to-face manner. A portion of the first substrate is removed until being stopped by the buried stop layer.

In still another aspect, a method for forming a semiconductor device is disclosed. The semiconductor device includes a first substrate, a memory stack disposed on the first substrate and a plurality of channel structures each extending vertically through the memory stack. A first implantation is performed on the first substrate to implant a buried material in the first substrate. A buried stop layer is formed from the buried material in the first substrate. A portion of the first substrate is removed until being stopped by the buried stop layer.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIGS. 1A-1G illustrate cross-sections of an exemplary 3D semiconductor device at different stages of a manufacturing process, according to some aspects of the present disclosure.

FIG. 4 illustrates a flowchart of an exemplary method for forming a 3D memory device, according to some aspects of the present disclosure.

Figure 1C:
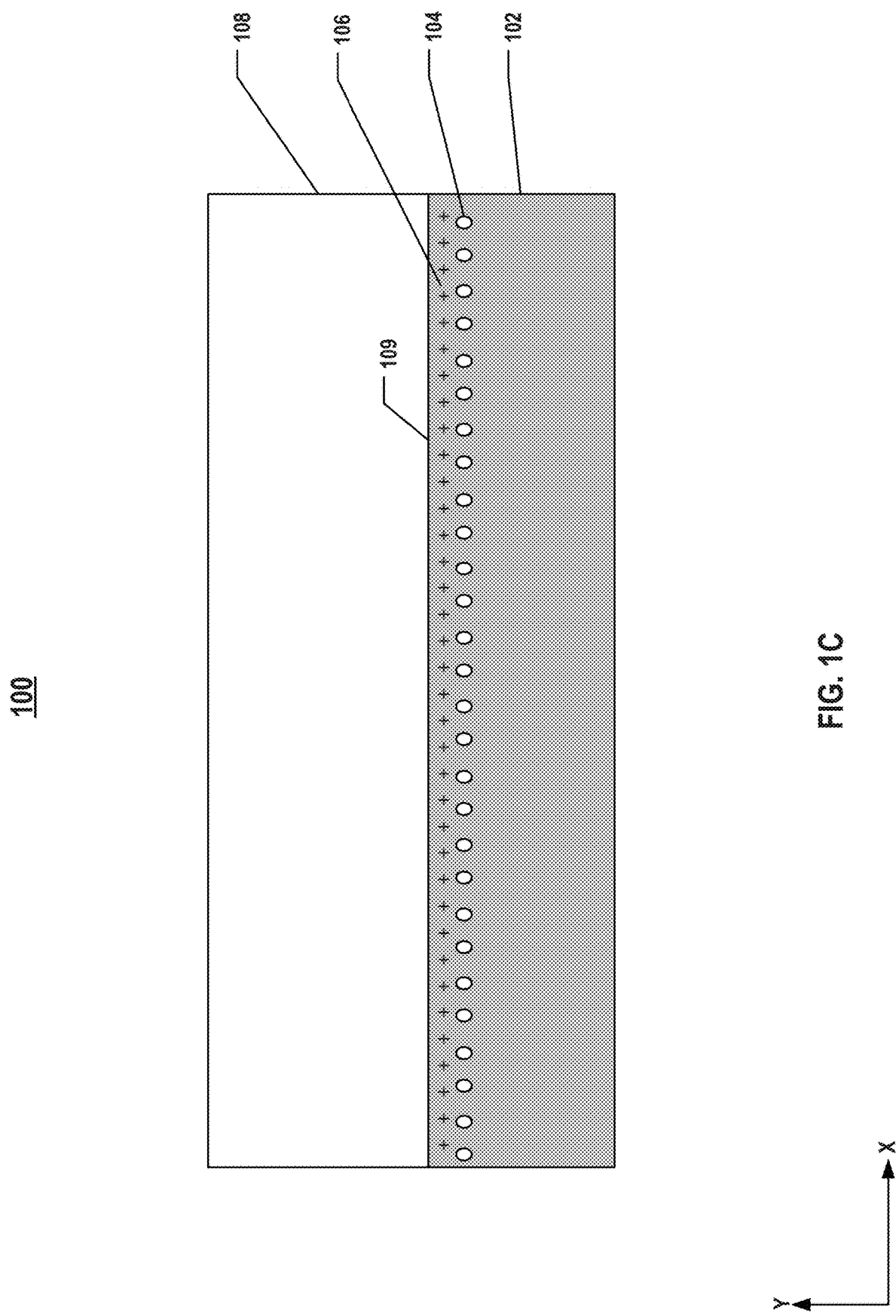

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

One important aspect of 3D memory development is the increase in the number of memory cells, requiring an increase in integration level at all. An application to memory production is a multiplication of the number of metal lines, such as word lines or bit lines, resulting in a higher stair structure and increased thickness. Therefore, it is particularly important to reduce the thickness of the whole memory structure when increasing the number of layers of metal lines.

One of the manufacturing processes to reduce the thickness of the whole memory structure is to thin the substrate having semiconductor devices or array structures formed therein. After thinning the substrate, the subsequent interconnections could be formed on the thinned substrate to reduce the thickness of the whole memory structure. Another reason of thinning the substrate is to expose interconnects buried in the substrate, e.g., the through silicon contacts (TSCs) structure, and make it easier to make interconnections between the pad-out interconnect layer above the thinned substrate and the interconnects under the substrate in particular in a face-to-face bonded 3D architecture.

However, to thin the substrate having semiconductor devices or array structures formed therein, the substrate may be generally treated by a chemical-mechanical polishing (CMP) process, and the thickness of the substrate and the uniformity of the thinned surface are difficult to control in the CMP process. In addition, when using the CMP process to thin the substrate, several different CMP steps having different roughness of polishing are required to achieve the expected thickness and lead to high manufacturing cost.

To address the aforementioned issues, the present disclosure introduces a solution in which the substrate is formed a buried stop layer, and the thinning operation may be stopped by the buried stop layer. The buried material may be implanted in the substrate and diffused to a predefined depth. The buried material is synthesized to an oxide layer in the predefined depth during the anneal operation of forming array structure. The oxide layer functions as a buried stop layer. Since the buried stop layer is formed between the substrate and the doped semiconductor layer and the buried stop layer has a characteristic of anti-corrosion, the buried stop layer may protect the doped semiconductor layer when thinning the substrate. Therefore, the uniformity of the top surface of the doped semiconductor layer may be improved, the CMP operation may be simplified, and the manufacturing cost may be further decreased.

Figure 3:
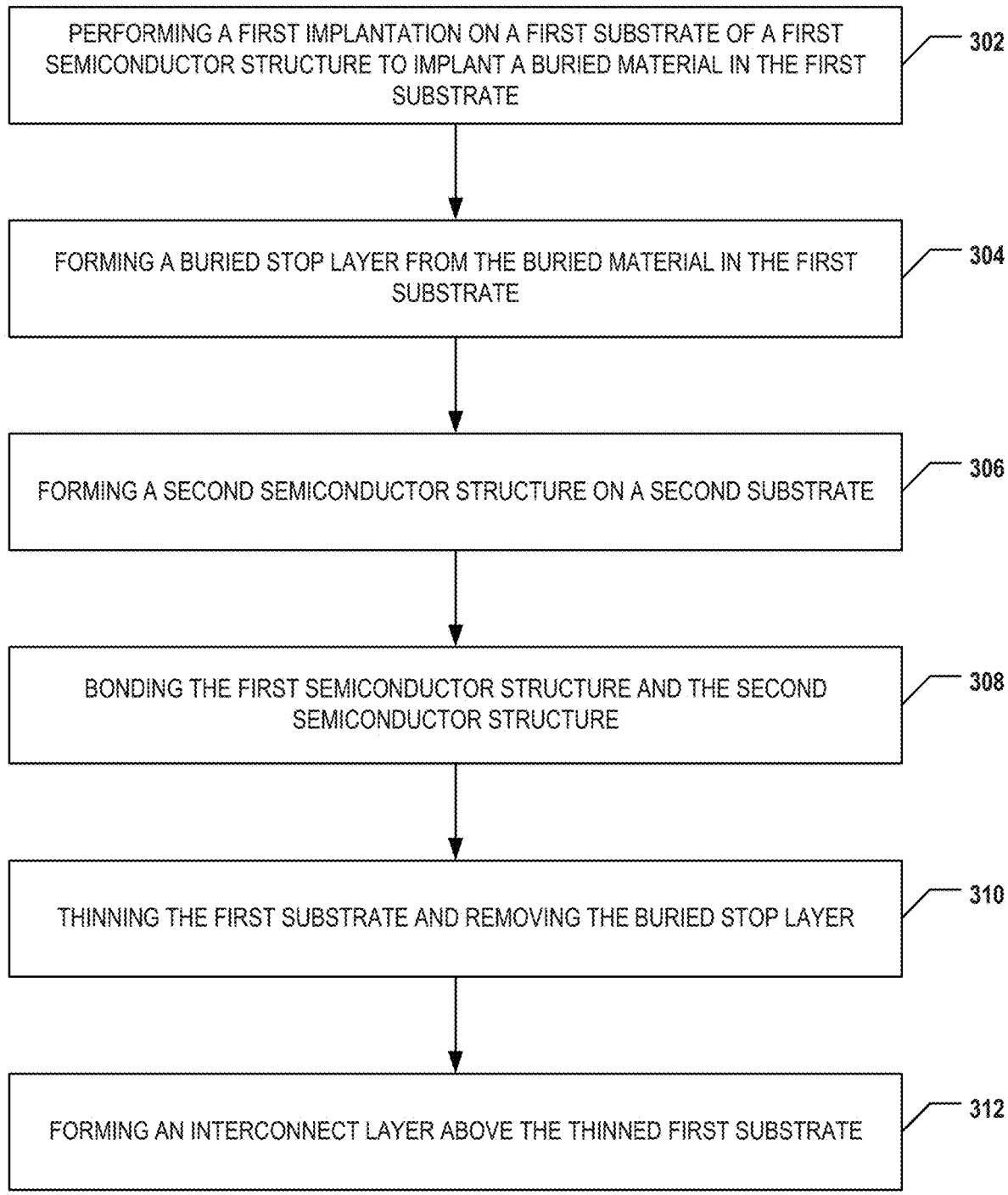
FIG. 3 illustrates a flowchart of an exemplary method for forming a 3D semiconductor device, according to some aspects of the present disclosure.

FIGS. 1A-1G illustrate cross-sections of an exemplary 3D semiconductor device 100 at different stages of a manufacturing process, according to some aspects of the present disclosure, and FIG. 3 illustrates a flowchart of an exemplary method 300 for forming a 3D semiconductor device, according to some aspects of the present disclosure. For the purpose of better explaining the present disclosure, the cross-sections of 3D semiconductor device 100 in FIGS. 1A-1G and the flowchart of method 300 in FIG. 3 will be described together. It is understood that the operations shown in method 300 are not exhaustive and that other operations can be performed as well before, after, or between any of the illustrated operations. Further, some of the operations may be performed simultaneously, or in a different order than shown in FIGS. 1A-1G and FIG. 3.

It is noted that x and y axes are included in FIGS. 1A-1G to further illustrate the spatial relationship of the components in a 3D semiconductor device having a substrate. A substrate includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device is determined relative to the substrate of the semiconductor device in the y-direction (i.e., the vertical direction) when the substrate is positioned in the lowest plane of the semiconductor device in the y-direction. The same notion for describing spatial relationships is applied throughout the present disclosure.

As shown in FIG. 1A and operation 302 of FIG. 3, a buried material 104 is formed in a first substrate 102. In some implementations, first substrate 102 may be a silicon substrate. In some implementations, first substrate 102 may be made of any suitable materials, such as silicon, polysilicon, glass, or sapphire. In some implementations, buried material 104 may include oxygen, and buried material 104 may be implanted into first substrate 102 by performing an oxygen ion implantation. In some implementations, buried material 104 may include carbon, and buried material 104 may be implanted into first substrate 102 by performing a carbon ion implantation. In some implementations, buried material 104 may be implanted into first substrate 102 with a depth D as shown in FIG. 1A. Buried material 104 may be synthesized to a buried stop layer in later operations, and 3D semiconductor device 100 is flipped over to perform the bonding and thinning operations. When thinning first substrate 102, a portion of first substrate 102 would be protected by the buried stop layer. After thinning first substrate 102 and removing the buried stop layer, a remainder of the first substrate may have a thickness equals to the implantation depth D. In some implementations, depth D may be between 0.1 μm and 2 μm. In some implementations, depth D may be between 0.1 μm and 1 μm. In some implementations, depth D may be between 0.1 μm and 0.8 μm.

After forming buried material 104 in first substrate 102, a second implantation may be performed on first substrate 102 to form a doped semiconductor layer 106 in first substrate 102 above buried material 104, as shown in FIG. 1B. In some implementations, doped semiconductor layer 106 may be an n-type doped semiconductor layer. In some implementations, doped semiconductor layer 106 may include silicon doped with n-type dopant(s), such as phosphorus, arsenic, antimony, bismuth, or lithium. In some implementations, doped semiconductor layer 106 may include polysilicon doped with n-type dopant(s), such as phosphorus, arsenic, antimony, bismuth, or lithium.

As shown in FIG. 1C and operation 304 of FIG. 3, a first semiconductor structure 108 is formed on first substrate 102. In some implementations, first semiconductor structure 108 may include a memory array semiconductor structure including a plurality of channel structures (not shown) each extending vertically through a memory stack (not shown) formed on doped semiconductor layer 106. It is understood that the example of the memory array semiconductor structure is merely illustrative and is not limiting, and those skilled in the art can change to other suitable semiconductor devices according to requirements, all of which are within the scope of the present disclosure. For example, first semiconductor structure 108 may include any suitable logic devices (e.g., central processing unit (CPU), graphics processing unit (GPU), and application processor (AP)), volatile memory devices (e.g., dynamic random-access memory (DRAM) and static random-access memory (SRAM)), non-volatile memory devices (e.g., NAND Flash memory, NOR Flash memory), or any combinations thereof.

In some implementations, when forming first semiconductor structure 108, one or more thermal operations may be used in various process stages. For example, a thermal annealing operation may be used to prepare and clean bonding surface, another thermal annealing operation may be used to form monocrystalline layer, a Rapid Thermal Anneal (RTA) or laser anneal may be used for a silicidation operation, a thermal CVD operation may be used to deposit metal layers, or a post deposition annealing may be used after a deposition operation. During the one or more thermal operations for forming first semiconductor structure 108, buried material 104 may be synthesized to a buried stop layer 110 by the high temperature, as shown in FIG. 1D.

In some implementations, the thermal operation may be performed at a temperature higher than 400° C. In some implementations, the thermal operation may be performed at a temperature higher than 600° C. In some implementations, the thermal operation may be performed at a temperature higher than 800° C. In some implementations, buried stop layer 110 may include silicon oxide layer or silicon carbon layer. Since buried stop layer 110 may be simultaneously formed during the thermal operations for forming first semiconductor structure 108, no additional annealing process is required to form buried stop layer 110. Hence, the process step could be simplified, and process cost could be lowered.

As shown in FIG. 1E and operation 306 of FIG. 3, a second semiconductor structure 114 is formed on a second substrate 112. Second substrate 112 may be a silicon substrate. In some implementations, second substrate 112 may be made of any suitable materials, such as silicon, polysilicon, glass, or sapphire. Second semiconductor structure 114 may include a plurality of transistors (not shown) formed therein. In some implementations, the plurality of transistors may be formed by using a plurality of processes including, but not limited to, photolithography, etching, thin film deposition, thermal growth, implantation, CMP, and any other suitable processes. In some implementations, second semiconductor structure 114 may include the peripheral circuits on second substrate 112 for facilitating the operations of the channel structures in first semiconductor structure 108 on first substrate. It is understood that the example of the transistor layer is merely illustrative and is not limiting, and those skilled in the art can change to other suitable semiconductor devices according to requirements, all of which are within the scope of the present disclosure. For example, second semiconductor structure 114 may include any suitable logic devices (e.g., CPU, GPU, and AP), volatile memory devices (e.g., DRAM and SRAM), non-volatile memory devices (e.g., NAND Flash memory, NOR Flash memory), or any combinations thereof.

First substrate 102 and first semiconductor structure 108 are flipped over and bonded with second semiconductor structure 114 and second substrate 112 in a face-to-face manner, as shown in FIG. 1E and operation 308. The face-to-face manner bonding of first substrate 102 and second substrate 112 is that first semiconductor structure 108 is bonded to second semiconductor structure 114 and first substrate 102 and second substrate 112 are located on outer side after the bonding. In some implementations, a first bonding layer (not shown) may be formed above first semiconductor structure 108, and a second bonding layer (not shown) may be formed above second semiconductor structure 114. When first substrate 102 and first semiconductor structure 108 are bonded to second semiconductor structure 114 and second substrate 112, the first bonding layer and the second bonding layer may be bonded together to form a bonding interface 109 between first semiconductor structure 108 and second semiconductor structure 114. In some implementations, a treatment process, e.g., a plasma treatment, a wet treatment, and/or a thermal treatment, is applied to the bonding surfaces prior to the bonding. After the bonding, the bonding contacts in the first bonding layer and the second bonding layer are aligned and in contact with one another, such that memory stack and channel structures formed therethrough can be electrically connected to the peripheral circuits. In some implementations, the bonding is performed by hybrid bonding also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 109 is the place at which the two bonding layers and are met and bonded. In practice, bonding interface 109 can be a layer with a certain thickness that includes the top surface of the bottom bonding layer and the bottom surface of the top bonding layer after the bonding.

Figure 1F:
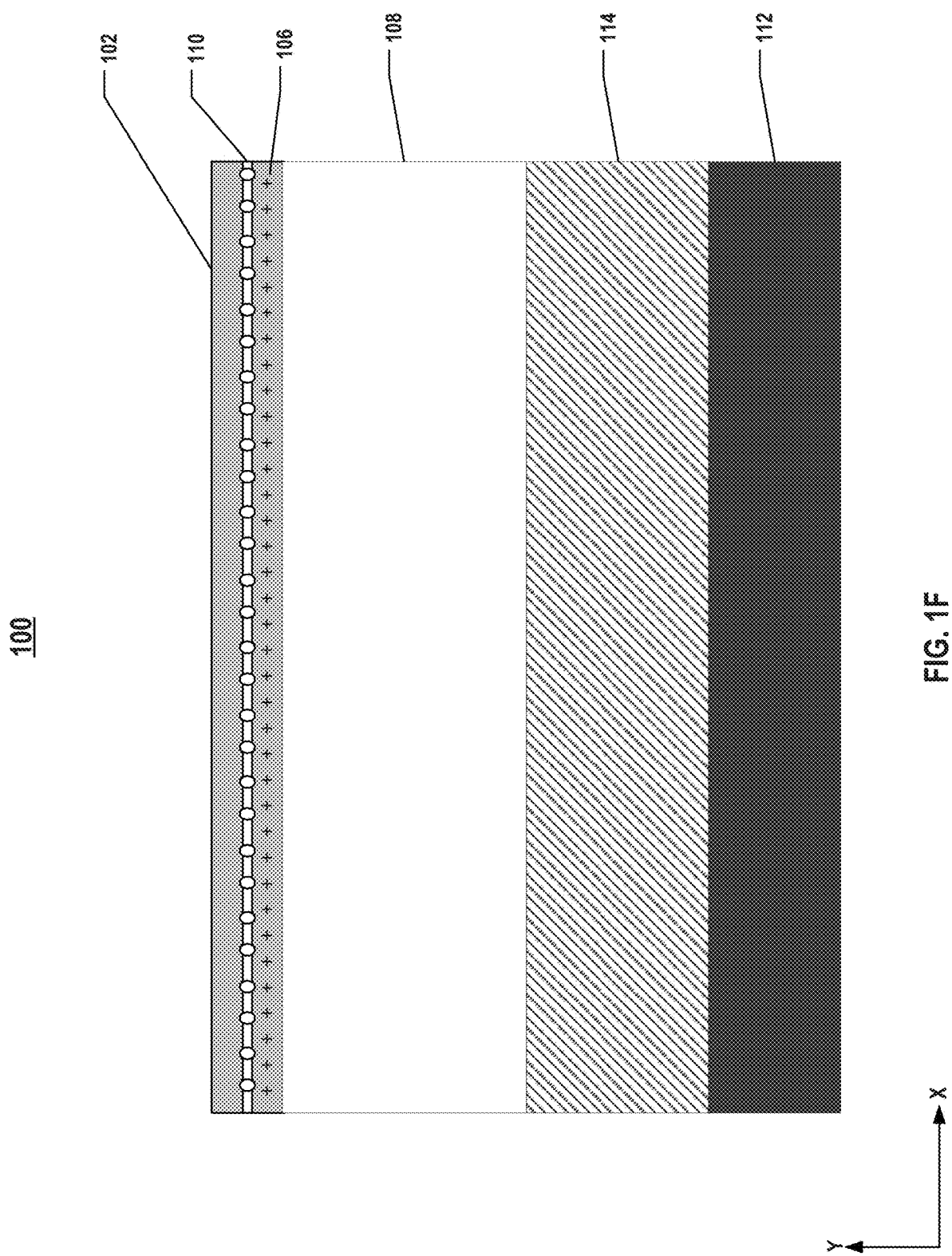

As shown in FIG. 1F and operation 310 of FIG. 3, a thinning operation may be performed on first substrate 102. In some implementations, the thinning operation may include one or more steps to remove a portion of first substrate 102 sequentially. In some implementations, a grinding operation may be performed to coarsely remove a portion of first substrate 102 until a thinned layer of first substrate 102 remains on buried stop layer 110, as shown in FIG. 1F. In some implementations, a wet etching operation may be performed to remove the residual first substrate 102 on buried stop layer 110 until exposing buried stop layer 110. In some implementations, a CMP operation may be performed to remove buried stop layer 110 to expose doped semiconductor layer 106, as shown in FIG. 1G. It is understood that there are various ways to perform the thinning operation and the removal stages, the processes described above are merely illustrative and is not limiting, and those skilled in the art can change to other suitable removal processes according to requirements, all of which are within the scope of the present application. For example, the coarse removal operation of first substrate 102 may be performed by using grinding, wet etching, dry etching, or CMP operation, or the residual first substrate 102 may be removed by wet etching, dry etching, or CMP operation.

After exposing doped semiconductor layer 106, an interconnect layer may be further formed above doped semiconductor layer 106, as shown in operation 312 of FIG. 3. In some implementations, the interconnect layer may connect the memory array and the peripheral devices for controlling signals to and from the memory array. In some implementations, the interconnect layer may include contacts or at least one conductor layer, in which formed in one or more dielectric layers. In some implementations, the interconnect layer may include a plurality of interconnects, including lateral interconnect lines and vertical interconnect access (via) contacts. In some implementations, the interconnect layer may broadly include any suitable types of interconnects, such as middle-end-of-line (MEOL) interconnects and back-end-of-line (BEOL) interconnects. In some implementations, doped semiconductor layer 106 may function as a source line of the channel structures formed in first semiconductor structure 108. It is understood that in case logic devices, such as transistors, are formed in first semiconductor structure 108, doped semiconductor layer 106 may function as the well of the transistors as well.

Since buried stop layer 110 is formed in first substrate 102 above doped semiconductor layer 106 and buried stop layer 110 has a characteristic of anti-corrosion, buried stop layer 110 may protect doped semiconductor layer 106 when removing the residual first substrate 102. Therefore, the uniformity of the top surface of doped semiconductor layer 106 may be improved, the CMP operation may be simplified, and the manufacturing cost may be further decreased.

Figure 2A:
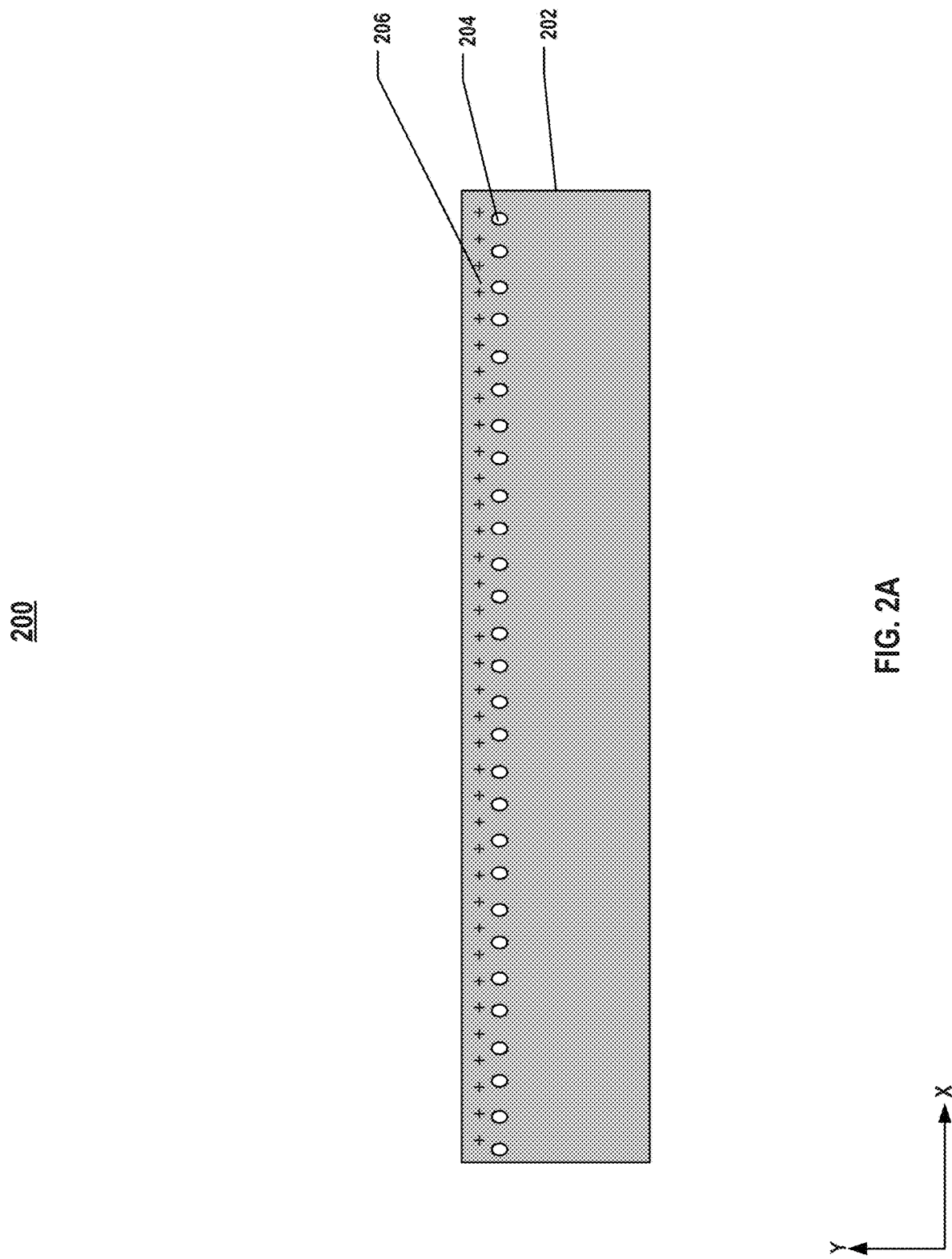
FIGS. 2A-2F illustrate cross-sections of an exemplary 3D memory device at different stages of a manufacturing process, according to some aspects of the present disclosure.

FIGS. 2A-2F illustrate cross-sections of an exemplary 3D memory device 200 at different stages of a manufacturing process, according to some implementations of the present disclosure, and FIG. 4 illustrates a flowchart of an exemplary method 400 for forming a 3D memory device, according to some aspects of the present disclosure. For the purpose of better explaining the present disclosure, the cross-sections of 3D memory device 200 in FIGS. 2A-2F and the flowchart of method 400 in FIG. 4 will be described together. FIG. 2A shows a semiconductor structure including a first substrate 202, a buried material 204, and a doped semiconductor layer 206. The process for forming buried material 204 and doped semiconductor layer 206 in first substrate 202 may be similar to the operations shown in FIGS. 1A-1C.

Figure 2B:
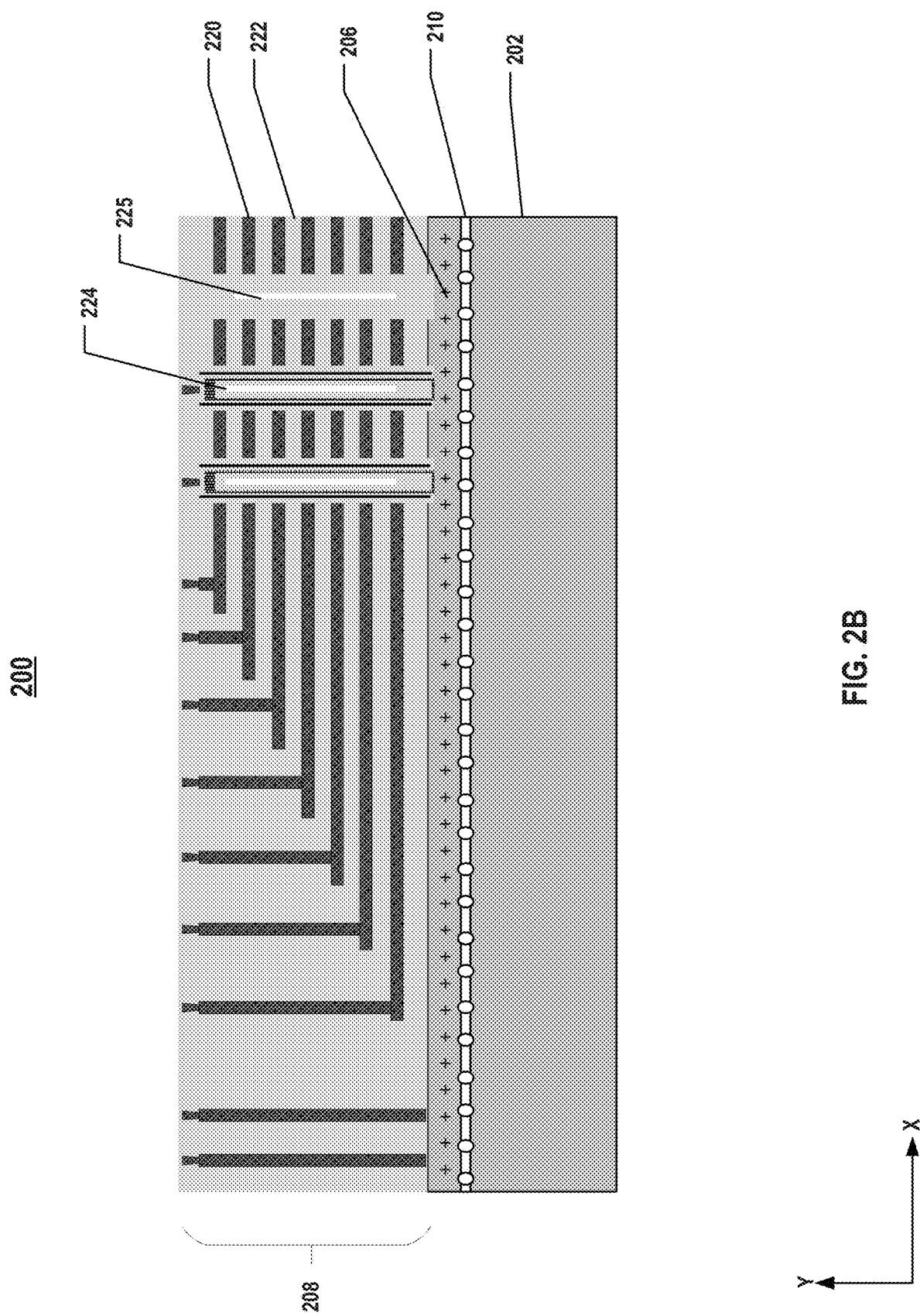

As shown in FIG. 2B and operation 402, a first semiconductor structure including first device layer 208 and first substrate 202 is formed. First device layer 208 is formed on doped semiconductor layer 206, doped semiconductor layer 206 is formed on buried stop layer 210, and doped semiconductor layer 206 and buried stop layer 210 are formed in first substrate 202. Doped semiconductor layer 206 may include silicon or polysilicon doped with n-type dopant(s), such as phosphorus, arsenic, antimony, bismuth, or lithium, using ion implantation and/or thermal diffusion.

During the one or more thermal operations for forming first device layer 208, buried material 204 may be synthesized to buried stop layer 210 by the high temperature. In some implementations, buried stop layer 210 may include silicon oxide layer or silicon carbon layer. In some implementations, the thermal operation may be performed at a temperature higher than 400° C. In some implementations, the thermal operation to synthesize buried stop layer 210 may be performed at a temperature higher than 600° C. In some implementations, the thermal operation may be performed at a temperature higher than 800° C. Since buried stop layer 210 may be simultaneously formed during the thermal operations for forming first device layer 208, no additional annealing process is required to form buried stop layer 210. Hence, the process step could be simplified, and process cost could be lowered.

As shown in FIG. 2B, a memory stack including a plurality pairs of a conductive layer 220 and a dielectric layer 222 is formed on doped semiconductor layer 206. The memory stack includes interleaved conductive layer 220 and dielectric layer 222. In some implementations, conductive layer 220 may include a layer of metal (e.g., tungsten), and dielectric layer 222 may include a layer of silicon oxide. The memory stack may be formed by one or more thin film deposition processes including, but not limited to, chemical vapor deposition (CVD), physical vapor deposition (PVD), atomic layer deposition (ALD), or any combination thereof, followed by a gate replacement process. As illustrated in FIG. 2B, a staircase structure can be formed on the edge of the memory stack, and an array of channel structures 224 each extending vertically through the memory stack and into doped semiconductor layer 206 is formed in first device layer 208.

The array of channel structure 224 may be formed by first forming a plurality of channel holes in the channel region of first device layer 208 to expose doped semiconductor layer 206. Then, a plurality of channel-forming layers may be conformally formed on sidewall and bottom of each channel hole. For example, a first silicon oxide layer, a silicon nitride layer, a second silicon oxide layer and a polysilicon layer may be sequentially and conformally form on sidewall and bottom of the channel hole. An etch operation may be then performed to remove a portion of the channel-forming layer (e.g., the part that is formed at the bottom of the channel hole) to expose doped semiconductor layer 206. Then, a dielectric core (e.g., a silicon oxide layer) may fill in the space at the center of the channel hole and electrically contact doped semiconductor layer 206. In some implementations, after the removal of the silicon oxide/silicon nitride/ silicon oxide (ONO) layers at the bottom of the channel hole and prior to the formation of the dielectric core, a polysilicon layer may be deposited over the ONO layers along the sidewall and on the bottom of the channel hole to form the semiconductor channel of channel structure 224. As shown in FIG. 2B, the bottom portion of the semiconductor channel (e.g., a polysilicon layer) of channel structure 224 may be in contact with doped semiconductor layer 206 to form an electrical connection therebetween.

In the present disclosure, since doped semiconductor layer 206 may function as a source line, a silicon epitaxy layer is not required on the bottom of the channel hole. Therefore, the epitaxial growth process (e.g., selective epitaxial growth, SEG) can be omitted to reduce the manufacturing cost.

Figure 2C:
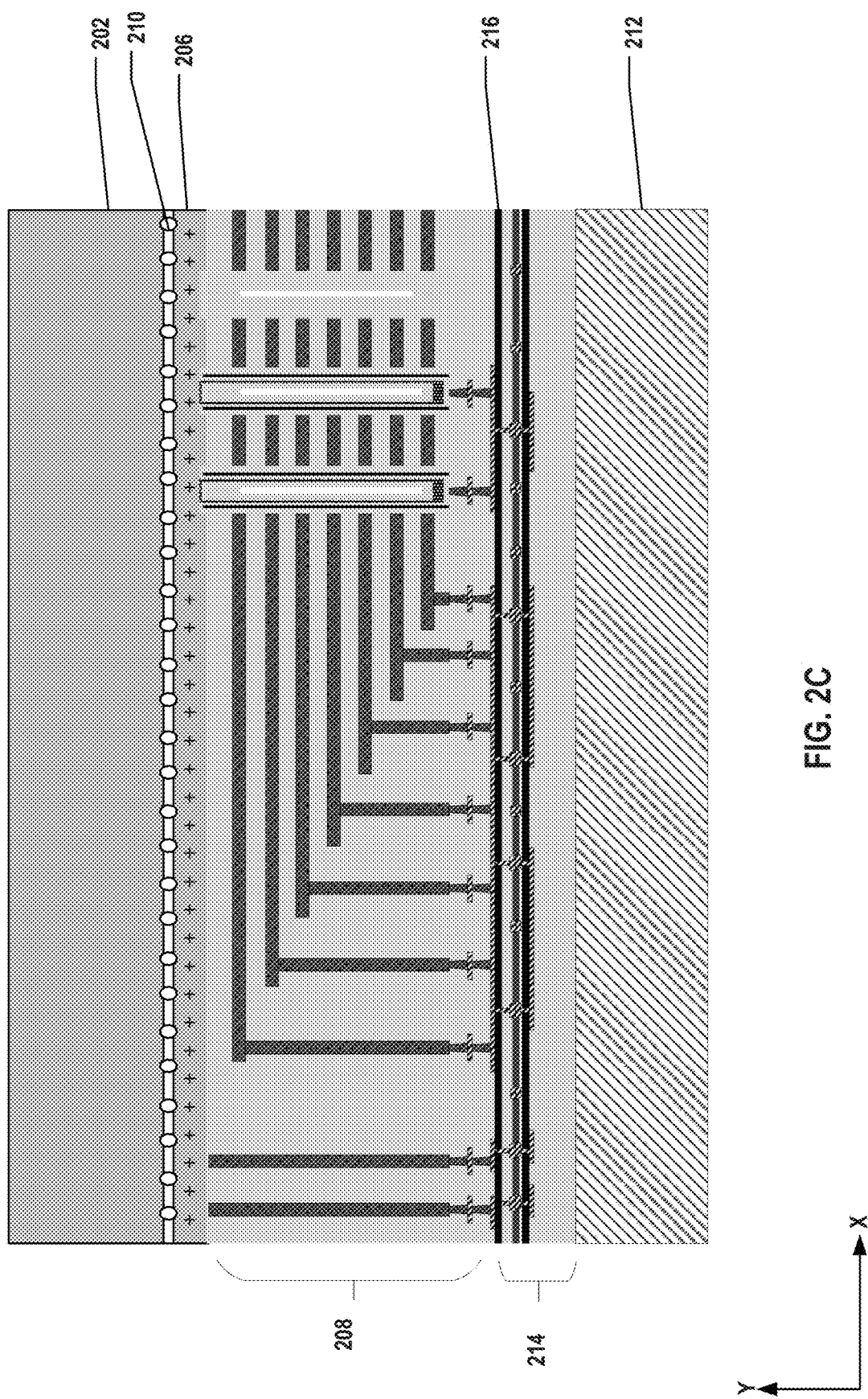

As shown in FIG. 2C and operation 404 of FIG. 4, a second semiconductor structure including a second device layer 214 and a second substrate 212 is formed. Second device layer 214 is formed on second substrate 212. Second substrate 212 may be a silicon substrate. In some implementations, second device layer 214 includes a plurality of transistors and may be formed on second substrate 212 using a plurality of processes including, but not limited to, photolithography, etching, thin film deposition, thermal growth, implantation, CMP, and any other suitable processes. In some implementations, doped regions (not shown) are formed in second device layer 214 by ion implantation and/or thermal diffusion, which function, for example, as source regions and/or drain regions of the transistors. In some implementations, isolation regions (e.g., STIs) are also formed in second device layer 214 by wet etching and/or dry etching and thin film deposition. In some implementations, second device layer 214 includes the transistors and functions as the peripheral circuits on second substrate 212.

As shown in FIG. 2C and operation 406, a bonding layer 216 is formed above second device layer 214, and the first semiconductor structure and the second semiconductor structure are bonded by bonding layer 216 in a face-to-face manner. Bonding layer 216 includes bonding contacts electrically connected to first device layer 208 and second device layer 214. To form bonding layer 216, an ILD layer is deposited using one or more thin film deposition processes, such as CVD, PVD, ALD, or any combination thereof. The bonding contacts through the ILD layer are formed using wet etching and/or dry etching, e.g., reactive ion etching (RIE), followed by one or more thin film deposition processes, such as ALD, CVD, PVD, any other suitable processes, or any combination thereof.

Figure 2D:
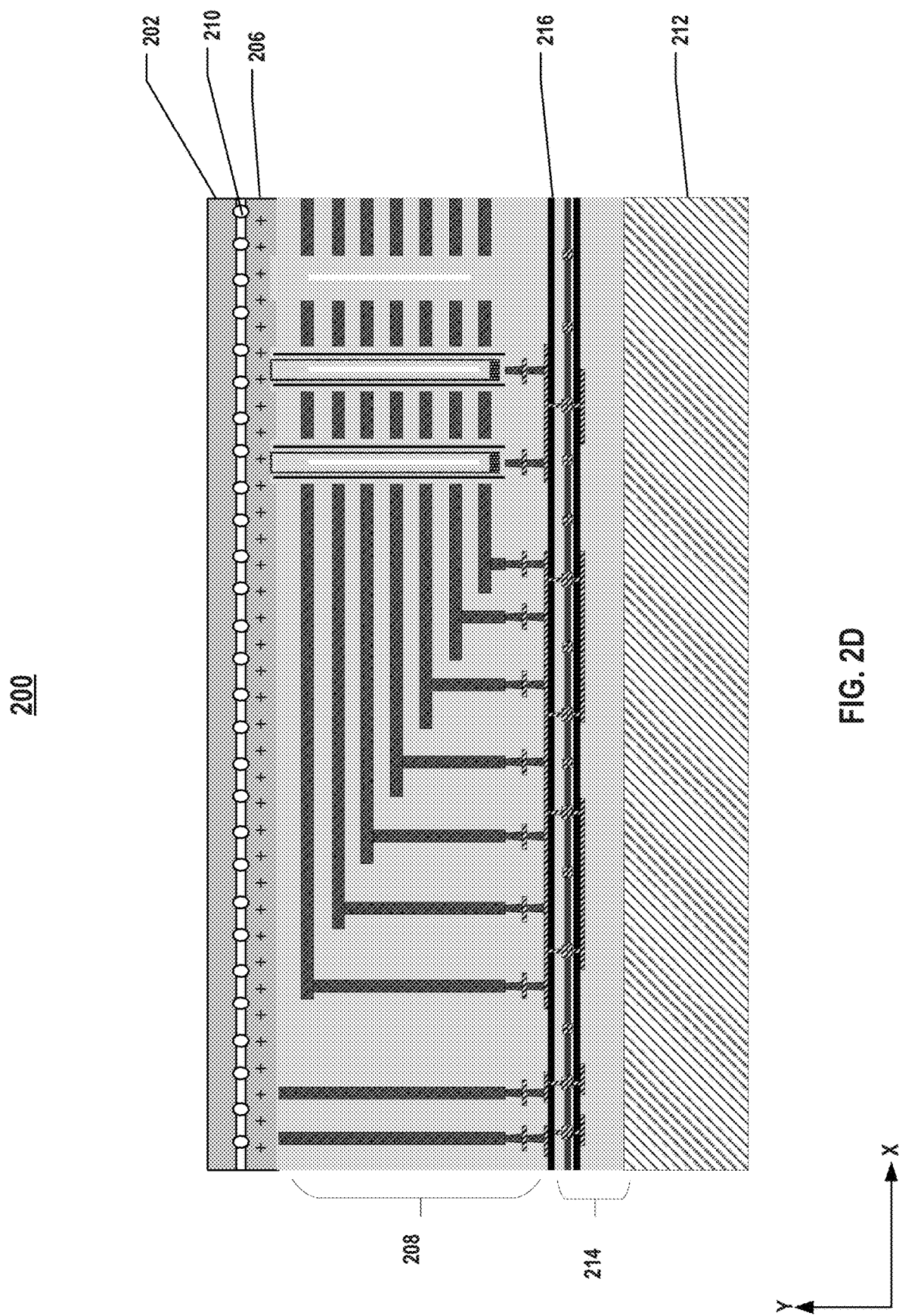
Figure 2E:
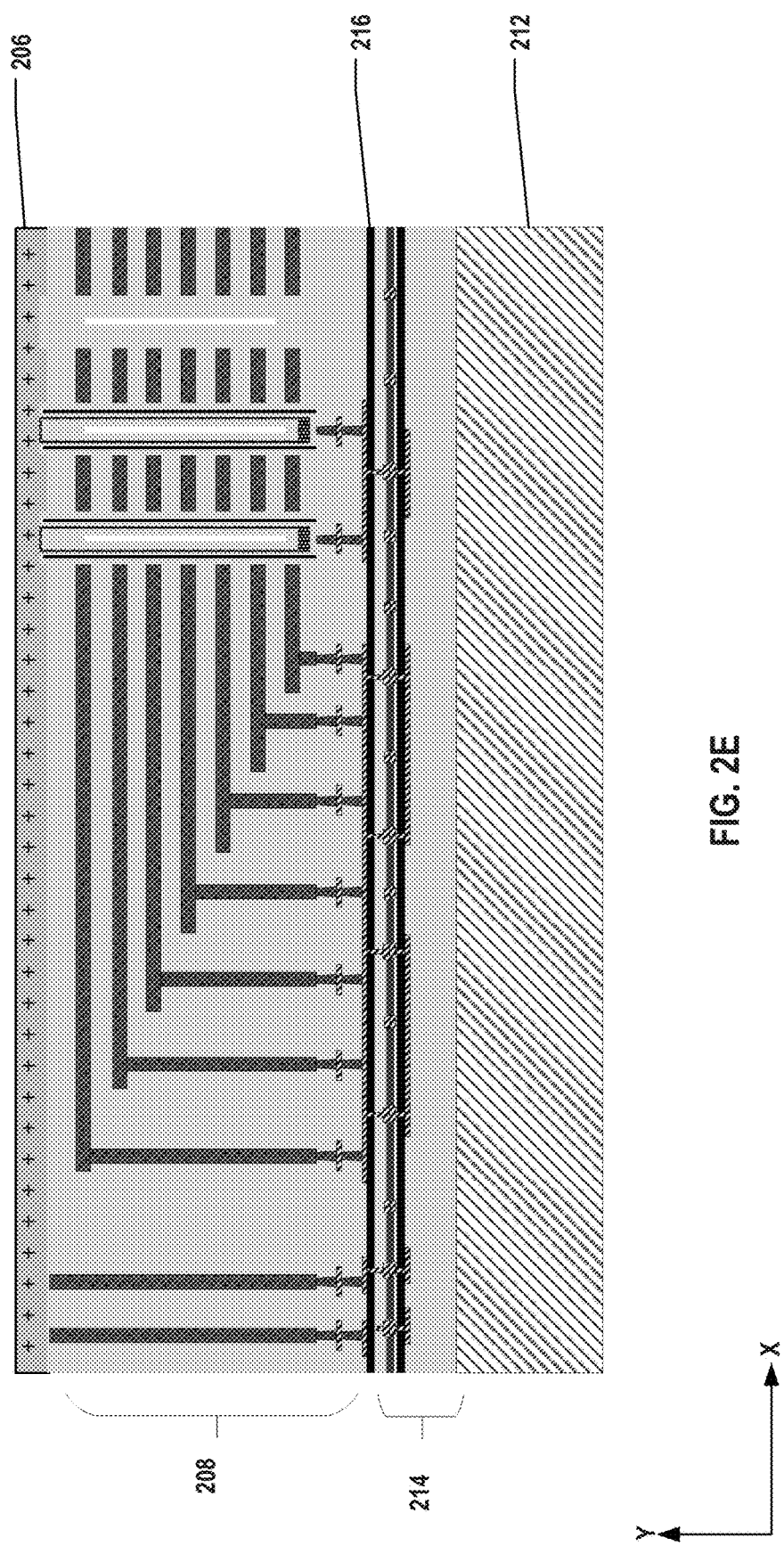

In operation 408, a portion of first substrate 202 is removed. In some implementations, the thinning operation may include one or more steps to remove a portion of first substrate 202 sequentially. In some implementations, a grinding operation may be performed to coarsely remove a portion of first substrate 202 until a thin layer of first substrate 202 remains on buried stop layer 210, as shown in FIG. 2D. In some implementations, a wet etching operation may be performed to remove the residual first substrate 202 on buried stop layer 210 until exposing buried stop layer 210. In some implementations, a CMP operation may be performed to remove buried stop layer 210 to expose doped semiconductor layer 206, as shown in FIG. 2E. It is understood that there are various ways to perform the thinning operation and the removal stages, the processes described above are merely illustrative and is not limiting, and those skilled in the art can change to other suitable removal processes according to requirements, all of which are within the scope of the present application. For example, the coarse removal operation of first substrate 202 may be performed by using grinding, wet etching, dry etching, or CMP operation, or the residual first substrate 202 may be removed by wet etching, dry etching, or CMP operation.

Figure 2F:
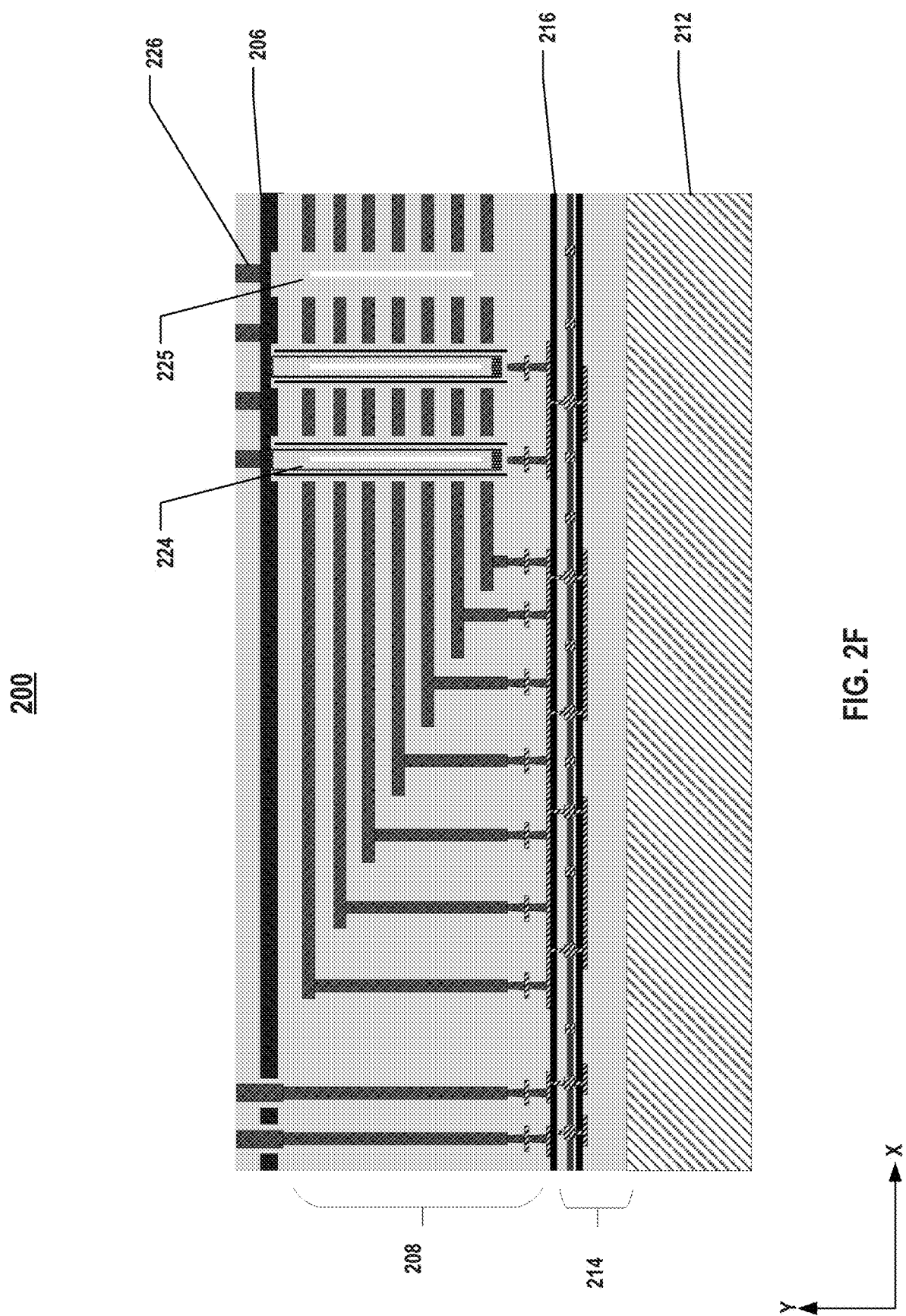

After exposing doped semiconductor layer 206, an interconnect layer 226 may be further formed above doped semiconductor layer 206, as shown in FIG. 2F. In some implementations, the interconnect layer may connect the memory array and the peripheral devices for controlling signals to and from the memory array. In some implementations, doped semiconductor layer 206 may function as a source line of the transistor formed in first device layer 208.

Since buried stop layer 210 is formed between first substrate 202 and doped semiconductor layer 206 and buried stop layer 210 has a characteristic of anti-corrosion, buried stop layer 210 may protect doped semiconductor layer 206 when removing the residual first substrate 202. Therefore, the uniformity of the top surface of doped semiconductor layer 206 may be improved, the CMP operation may be simplified, and the manufacturing cost may be further decreased. Moreover, doped semiconductor layer 206 may function as the common source line of array of channel structures 224, which may replace the source line function of a slit structure 225 extending vertically through the memory stack. As a result, slit structure 225 may be filled with dielectric materials, such as silicon oxide, without a conductor to reduce the parasitic capacitance between slit structure 225 and conductive layers 220.

Figure 6:
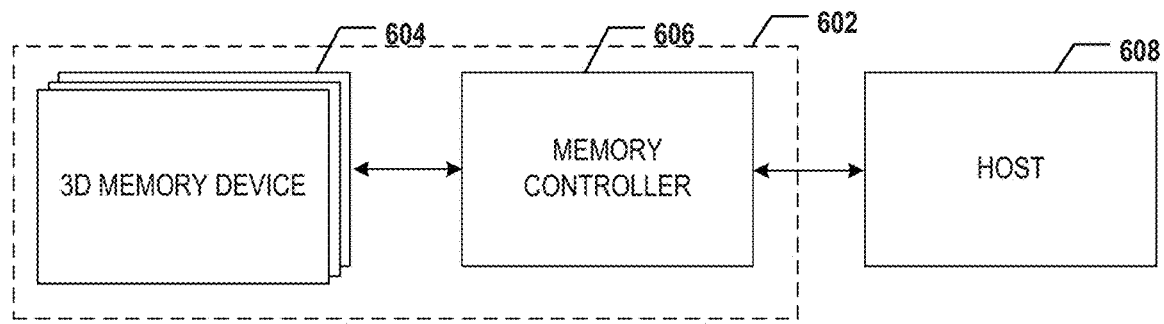
FIG. 6 illustrates a block diagram of an exemplary system having a 3D memory device, according to some aspects of the present disclosure.

FIG. 6 illustrates a block diagram of an exemplary system 600 having a memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more 3D memory devices 604 and a memory controller 606. Host 608 can be a processor of an electronic device, such as a PU, or a system-on-chip (SoC), such as an AP. Host 608 can be configured to send or receive the data to or from 3D memory devices 604.

3D memory device 604 can be any suitable 3D memory devices, which are fabricated using a buried stop layer in the substrate as disclosed herein, for example, according to FIGS. 2A-2F.

Memory controller 606 is coupled to 3D memory device 604 and host 608 and is configured to control 3D memory device 604, according to some implementations. Memory controller 606 can manage the data stored in 3D memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of 3D memory device 604, such as read, erase, and program operations. Memory controller 606 can also be configured to manage various functions with respect to the data stored or to be stored in 3D memory device 604 including, but not limited to bad-block management, garbage collection, logical-to-physical address conversion, wear leveling, etc. In some implementations, memory controller 606 is further configured to process error correction codes (ECCs) with respect to the data read from or written to 3D memory device 604. Any other suitable functions may be performed by memory controller 606 as well, for example, formatting 3D memory device 604. Memory controller 606 can communicate with an external device (e.g., host 608) according to a particular communication protocol. For example, memory controller 606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 7A, 7B:
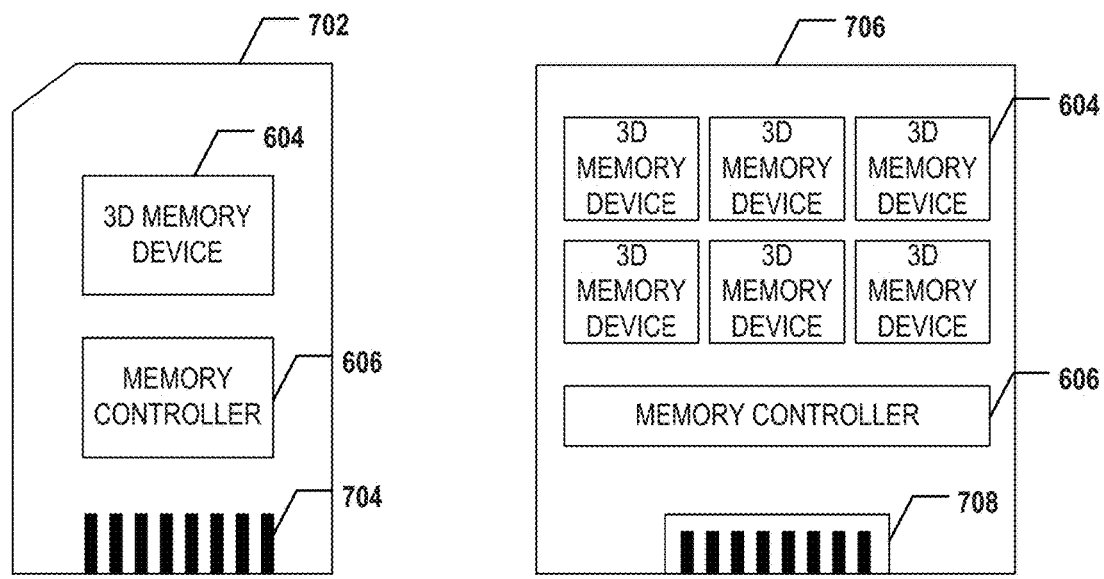
FIG. 7A illustrates a diagram of an exemplary memory card having a 3D memory device, according to some aspects of the present disclosure.
FIG. 7B illustrates a diagram of an exemplary solid-state drive (SSD) having a 3D memory device, according to some aspects of the present disclosure.

Memory controller 606 and one or more 3D memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single 3D memory device 604 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 702 can further include a memory card connector 704 coupling memory card 702 with a host (e.g., host 608 in FIG. 6). In another example as shown in FIG. 7B, memory controller 606 and multiple 3D memory devices 604 may be integrated into an SSD 706. SSD 706 can further include an SSD connector 708 coupling SSD 706 with a host (e.g., host 608 in FIG. 6). In some implementations, the storage capacity and/or the operation speed of SSD 706 is greater than those of memory card 702.

Figure 5:
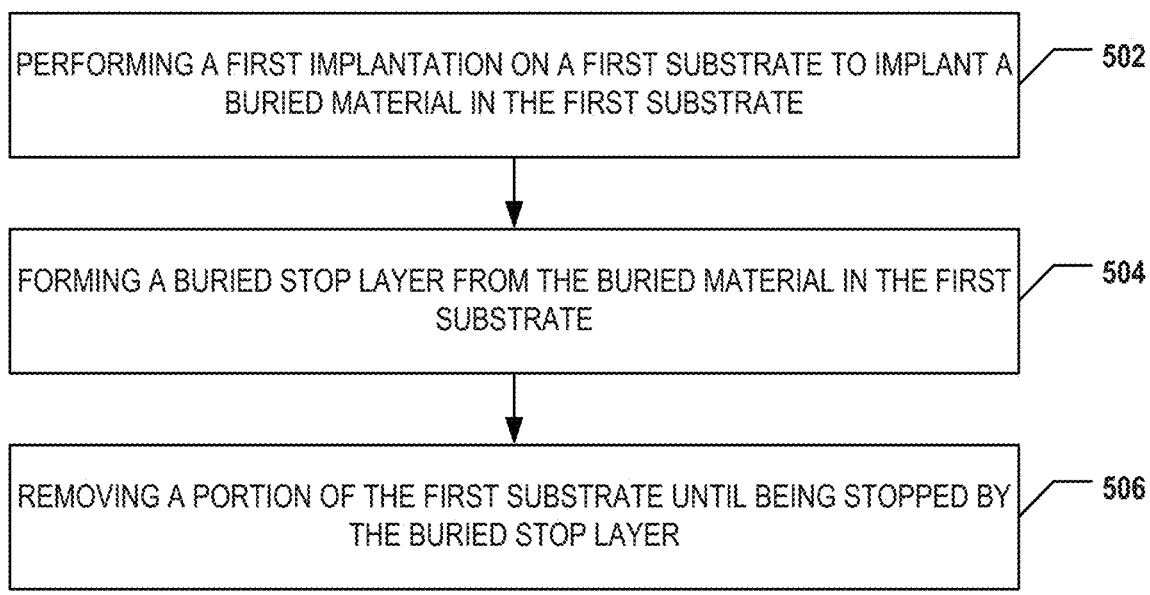
FIG. 5 illustrates a flowchart of an exemplary method for forming a semiconductor device, according to some aspects of the present disclosure.

It is understood that the buried stop layer and the fabrication method thereof described above are not limited to the applications of 3D memory devices, memory devices, or 3D semiconductor devices and may be applied to any suitable non-memory semiconductor device in 2D or 2.5D architectures. FIG. 5 illustrates a flowchart of an exemplary method 500 for forming a semiconductor device, according to some aspects of the present disclosure. In operation 502, a first implantation is performed on a first substrate to implant a buried material in the first substrate. In some implementations, the first substrate may be made of any suitable materials, such as silicon, polysilicon, glass, or sapphire. In some implementations, the buried material may include oxygen or carbon, and the buried material may be implanted into the first substrate by performing an oxygen ion implantation or a carbon ion implantation. In some implementations, after forming the buried material in the first substrate, a second implantation may be performed on the first substrate to form a doped semiconductor layer in the first substrate above the buried material. In some implementations, the doped semiconductor layer may be an n-type doped semiconductor layer. In some implementations, the doped semiconductor layer may include silicon doped with n-type dopant(s), such as phosphorus, arsenic, antimony, bismuth, or lithium. In some implementations, the doped semiconductor layer may include polysilicon doped with n-type dopant(s), such as phosphorus, arsenic, antimony, bismuth, or lithium.

In operation 504, a buried stop layer is formed from the buried material in the first substrate, and a first device layer is formed on the first substrate. In some implementations, the first semiconductor structure may include a memory array semiconductor structure including a plurality of channel structures each extending vertically through a memory stack formed on the doped semiconductor layer. In some implementations, when forming the first semiconductor structure, one or more thermal operations may be used in various process stages. For example, a thermal annealing operation may be used to prepare and clean bonding surface, another thermal annealing operation may be used to form monocrystalline layer, an RTA or laser anneal may be used for a silicidation operation, a thermal CVD operation may be used to deposit metal layers, or a post deposition annealing may be used after a deposition operation. During the one or more thermal processes for forming the first semiconductor structure, the buried material may be synthesized to a buried stop layer by the high temperature.

In some implementations, the thermal operation may be performed at a temperature higher than 400° C. In some implementations, the thermal operation may be performed at a temperature higher than 600° C. In some implementations, the thermal operation may be performed at a temperature higher than 800° C. In some implementations, the buried stop layer may include silicon oxide layer or silicon carbon layer. Since the buried stop layer may be simultaneously formed during the thermal operations for forming the first semiconductor structure, no additional annealing process is required to form the buried stop layer. Hence, the process step could be simplified, and process cost could be lowered.

In operation 506, a portion of the first substrate is removed until being stopped by the buried stop layer. In some implementations, the thinning operation may include one or more steps to remove a portion of the first substrate sequentially. In some implementations, a grinding operation may be performed to coarsely remove a portion of the first substrate until a thinned layer of the first substrate remains on the buried stop layer. In some implementations, a wet etching operation may be performed to remove the residual first substrate on the buried stop layer until exposing the buried stop layer. In some implementations, a CMP operation may be performed to remove the buried stop layer to expose the doped semiconductor layer. It is understood that there are various ways to perform the thinning operation and the removal stages, the processes described above are merely illustrative and is not limiting, and those skilled in the art can change to other suitable removal processes according to requirements, all of which are within the scope of the present application.

According to one aspect of the present disclosure, a method for forming a 3D semiconductor device is disclosed. A first implantation is performed on a first substrate of a first semiconductor structure to form a buried stop layer in the first substrate. A second semiconductor device is formed. The first semiconductor structure and the second semiconductor device are bonded. The first substrate is thinned and the buried stop layer is removed, and an interconnect layer is formed above the thinned first substrate.

In some implementations, the first implantation is performed on the first substrate of the first semiconductor structure to implant a buried material in the first substrate, and a thermal operation is performed on the first semiconductor structure to synthesize the buried stop layer from the buried material.

In some implementations, a second implantation is performed on a portion of the first substrate above the buried material to form a doped semiconductor layer in the first substrate above the buried material. In some implementations, an oxygen ion implantation is performed to implant oxygen ions to a predefined depth in the first substrate. In some implementations, a carbon ion implantation is performed to implant carbon ions to a predefined depth in the first substrate.

In some implementations, the buried stop layer includes silicon oxide or silicon carbon. In some implementations, an n-type doping operation is performed in the first substrate above the buried material. In some implementations, the first substrate is doped with phosphorus, arsenic, antimony, bismuth, or lithium.

In some implementations, a first portion of the first substrate thinner than a depth of the buried stop layer is removed, and a second portion of the first substrate is removed to remove the buried stop layer.

In some implementations, the first semiconductor structure includes the first substrate, a memory stack disposed on the first substrate and including a plurality of conductor/dielectric layer pairs, and a plurality of channel structures each extending vertically through the memory stack. In some implementations, each of the channel structures includes a semiconductor channel extending vertically through the conductor/dielectric layer pairs, and a memory film disposed laterally between the conductor/dielectric layer pairs and the semiconductor channel.

According to another aspect of the present disclosure, a method for forming a 3D semiconductor device is disclosed. A first semiconductor structure is formed, the first semiconductor structure includes a first substrate and a first device layer formed on a first substrate. A buried stop layer is formed in the first substrate. A second semiconductor structure is formed, and the second semiconductor structure includes a second device layer formed on a second substrate. The first semiconductor structure and the second semiconductor structure are bonded in a face-to-face manner. A portion of the first substrate is removed until being stopped by the buried stop layer.

In some implementations, a first implantation is performed on the first substrate to implant a buried material in the first substrate, a second implantation is performed on a portion of the first substrate above the buried material to form a doped layer in the first substrate above the buried material, and a thermal operation is performed on the first semiconductor structure to synthesize the buried stop layer from the buried material.

In some implementations, the thermal operation is performed when forming the first device layer on the first substrate. In some implementations, the buried material includes oxygen ion or carbon ion. In some implementations, the buried stop layer includes silicon oxide or silicon carbon.

In some implementations, a first thinning operation is performed to remove a portion of the first substrate thinner than a depth of the buried stop layer, and a second thinning operation is performed to remove a portion of the first substrate until exposing the buried stop layer. In some implementations, the portion of the first substrate is removed until exposing the buried stop layer and removing the buried stop layer. In some implementations, the first thinning operation includes a wafer grinding operation. In some implementations, the second thinning operation includes a dry etching, a wet etching, or a CMP operation.

In some implementations, at least one of the first and second device layers includes an array of channel structures. In some implementations, a remainder of the first substrate after the removing functions as a source line of the array of channel structures.

According to a further aspect of the present disclosure, a method for forming a semiconductor device is disclosed. The semiconductor device includes a first substrate, a memory stack disposed on the first substrate and a plurality of channel structures each extending vertically through the memory stack. A first implantation is performed on a first substrate to implant a buried material in the first substrate. A buried stop layer is formed from the buried material in the first substrate, and a first semiconductor structure is formed on the first substrate. A portion of the first substrate is removed until being stopped by the buried stop layer.

In some implementations, a first thinning operation is performed to remove a portion of the first substrate thinner than a depth of the buried stop layer, and a second thinning operation is performed to remove a portion of the first substrate until exposing the buried stop layer. In some implementations, the portion of the first substrate is removed until exposing the buried stop layer and removing the buried stop layer. In some implementations, the first thinning operation includes a wafer grinding operation. In some implementations, the second thinning operation includes a dry etching, a wet etching or a CMP operation.

In some implementations, a thermal operation is performed on the semiconductor device to synthesize the buried stop layer from the buried material. In some implementations, the buried material includes oxygen ion or carbon ion. In some implementations, the buried stop layer includes silicon oxide layer or silicon carbon layer.

In some implementations, the thermal operation is performed when forming the first semiconductor structure on the first substrate. In some implementations, a second implantation is performed on a portion of the first substrate above the buried material to form a doped layer in the first substrate above the buried material.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) semiconductor device, comprising:
    performing a first implantation on a first substrate to form a buried stop layer in the first substrate;
    forming a first semiconductor structure on the first substrate, the first semiconductor structure comprising a semiconductor device;
    forming a second semiconductor structure;
    bonding the first semiconductor structure on the first substrate and the second semiconductor structure to electrically connect the first semiconductor structure with the second semiconductor structure;
    after electrically connecting the first and second semiconductor structures, thinning the first substrate and removing the buried stop layer; and
    forming an interconnect layer above the thinned first substrate.

2. The method of claim 1, wherein performing the first implantation on the first substrate to form the buried stop layer in the first substrate, comprises:
    performing the first implantation on the first substrate to implant a buried material in the first substrate; and performing a thermal operation on the first semiconductor structure on the first substrate to synthesize the buried stop layer from the buried material.

3. The method of claim 2, further comprising:
performing a second implantation on a portion of the first substrate above the buried material to form a doped semiconductor layer above the buried material.

4. The method of claim 1, wherein performing the first implantation on the first substrate, comprises:
performing an oxygen ion implantation to implant oxygen ions to a predefined depth in the first substrate.

5. The method of claim 1, wherein performing the first implantation on the first substrate, comprises:
performing a carbon ion implantation to implant carbon ions to a predefined depth in the first substrate.

6. The method of claim 1, wherein the buried stop layer comprises silicon oxide or silicon carbon.

7. The method of claim 3, wherein performing the second implantation on the portion of the first substrate above the buried material, comprises:
performing an n-type doping operation in the first substrate above the buried material.

8. The method of claim 3, wherein performing the second implantation comprises:
doping the first substrate with phosphorus, arsenic, antimony, bismuth, or lithium.

9. The method of claim 1, wherein thinning the first substrate and removing the buried stop layer, comprises:
removing a first portion of the first substrate thinner than a depth of the buried stop layer; and
removing a second portion of the first substrate to remove the buried stop layer.

10. The method of claim 3, wherein forming the first semiconductor structure, comprises:
forming a memory stack above the doped semiconductor layer of the first substrate, the memory stack comprises a plurality of conductor/dielectric layer pairs;
forming a plurality of channel structures each extending through the memory stack; and
forming an insulating structure extending through the memory stack.

11. The method of claim 10, wherein the insulating structure comprises an insulating layer.

12. A method for forming a three-dimensional (3D) semiconductor device, comprising:
forming a first semiconductor structure, the first semiconductor structure comprising a first substrate and a first device layer formed on the first substrate, wherein forming the first semiconductor structure comprises:
forming a buried stop layer in the first substrate;
forming a second semiconductor structure comprising a second device layer formed on a second substrate;
bonding the first device layer of the first semiconductor structure and the second device layer of the second semiconductor structure to electrically connect the first device layer with the second device layer; and
after electrically connecting the first device layer and the second device layer, removing a portion of the first substrate until being stopped by the buried stop layer.

13. The method of claim 12, wherein forming the buried stop layer in the first substrate, comprises:

performing a first implantation on the first substrate to implant a buried material in the first substrate;
performing a second implantation on a portion of the first substrate above the buried material to form a doped semiconductor layer in the first substrate above the buried material; and
performing a thermal operation on the first semiconductor structure to synthesize the buried stop layer from the buried material.

14. A method for forming a semiconductor device, the semiconductor device comprising a first substrate, a memory stack disposed on the first substrate and a plurality of channel structures each extending through the memory stack, the method comprising:
performing a first implantation on the first substrate to implant a buried material in the first substrate;
forming a doped layer in the first substrate and forming a buried stop layer from the buried material in the first substrate, the memory stack and the buried stop layer being arranged at opposite sides of the doped layer, and the doped layer extending continuously, in a lateral direction, on the buried stop layer; and
removing a portion of the first substrate until being stopped by the buried stop layer.

15. The method of claim 14, wherein removing a portion of the first substrate until being stopped by the buried stop layer, comprises:
performing a first thinning operation to remove a portion of the first substrate thinner than a depth of the buried stop layer; and
performing a second thinning operation to remove a portion of the first substrate until exposing the buried stop layer.

16. The method of claim 15, wherein performing the second thinning operation to remove the portion of the first substrate until exposing the buried stop layer, comprises:
removing the portion of the first substrate until exposing the buried stop layer and removing the buried stop layer.

17. The method of claim 14, wherein forming the buried stop layer from the buried material in the first substrate, comprises:
performing a thermal operation on the semiconductor device to synthesize the buried stop layer from the buried material.

18. The method of claim 14, wherein the buried material comprises oxygen ion or carbon ion.

19. The method of claim 14, wherein the buried stop layer comprises silicon oxide or silicon carbon.

20. The method of claim 14, after performing the first implantation on the first substrate to implant the buried material in the first substrate, further comprising:
performing a second implantation on a portion of the first substrate above the buried material to form the doped layer in the first substrate above the buried material.

* * * * *